United States Patent [19]

Miffitt

[11] 4,029,996

[45] June 14, 1977

[54] APPARATUS HAVING A PROTECTIVE CIRCUIT

[75] Inventor: Donald Charles Miffitt, Billerica, Mass.

[73] Assignee: The Gillette Company, Boston, Mass.

[22] Filed: Mar. 8, 1976

[21] Appl. No.: 665,110

[52] U.S. Cl. .............................. 307/326; 324/51; 307/116; 361/45
[51] Int. Cl.² .................................... H02H 5/12
[58] Field of Search ............ 317/9 A, 9 AC, 18 B, 317/DIG. 2, 146, 147; 324/51; 340/253 C, 253 R, 255, 258 B; 307/116, 117

[56] References Cited

UNITED STATES PATENTS

| 3,699,562 | 10/1972 | Kelly | 340/253 R |
| 3,737,744 | 6/1975 | Bader, Jr. | 317/DIG. 2 |
| 3,862,432 | 1/1975 | Larson | 307/116 |
| 3,946,288 | 3/1976 | Isaksson et al. | 317/DIG. 2 |
| 3,947,734 | 3/1976 | Fyler | 317/DIG. 2 |

Primary Examiner—Gerald Goldberg
Attorney, Agent, or Firm—Richard A. Wise; Oistein J. Bratlie; Raymond J. Devellis

[57] ABSTRACT

A conductive touch grid or plate incorporated in the handle portion of apparatus such as an appliance performs the on/off function of the appliance as well as sensing the impedance of the operator with respect to either the line or neutral side of an associated AC source. Whenever the sensed impedance indicates a potentially dangerous condition a switching element in series with the line conductor interrupts current flow to the appliance thereby protecting the operator.

17 Claims, 2 Drawing Figures

APPARATUS HAVING A PROTECTIVE CIRCUIT

BACKGROUND OF THE INVENTION

This invention relates to apparatus which may be operated when in contact with a portion of the operator's body such as his or her hands and includes protective circuitry therein.

More particularly, this invention relates to protective circuitry incorporated in an appliance such as a portable hand-held hair dyer, tool, or the like which protects the operator or user from electrocution.

It is known in the art that various devices and circuits are available which will prevent the operator of an appliance typically of the hand-held variety from an electrical shock which ultimately may result in the operator's death. Most typically, these electrocution proof devices utilize a differential current transformer which senses a small difference in current in normally balanced power lines or cables. Such a difference is typically caused by a leakage of current from one of the line conductors to ground, thus depriving the return line of some of its normal current which would establish a balance or zero difference in current at an associated sensor. When the differential current is below a predetermined level, typically about 0.005 amperes, the power is normally allowed to flow uninterrupted. If a larger differential current occurs, the circuit is interrupted since a potential death hazard to a human being is occurring. Typical of such a current differential transformer in such a ground fault protection scheme is described in the U.S. Pat. No. 3,213,321 issued to C. F. Dalziel.

The utilization of a current transformer for sensing fault conditions has inherent disadvantages such as the associated electronic circuitry required to be coupled to the current transformer for amplifying the sensed signal and the cost of the current transformer.

Some prior art shock prevention devices which attempt to avoid the use of such differential transformer utilize switching coils or relays which when a dangerous leakage occurs in the load, causes the biasing of various transistors which in turn disconnect the line voltage from the operator. Such attempts were neither accomplished in a fail-safe mode nor were they in the environment of portable appliances. Typically, they necessitated permanent type connections at the power source and/or extensive additional circuitry.

Finally, prior art ground fault circuit interrupters operated only when an actual fault (e.g. shock) occurred and not when the potentially dangerous conditions of the operator of the apparatus having the protective circuitry being too closely coupled to either the associated AC conductors or ground. The latter mode of operation for a protective circuit is most desirable since it disconnects prior to the actual shock and teaches the operator of the apparatus not to use apparatus of this type when he or she is contacting ground or is dangerously close to the hot side of the line.

A human being is always capacitively coupled to the environment. Ground being the most prevalent thing around, one is usually coupled closer to ground than to any other potential. The only occurrence which can upset this basic balance is if one is touching a conductor directly. Contacting a conductor in this way brings one's impedance toward the potential of that conductor. This impedance level depends on the contact resistance of the person. Dry, the contact resistance is usually 50,000 ohms to 500,000 ohms, wet; it can be as low as 1,000 ohms. The circuit of this invention requires the operator of the apparatus having the protective circuitry to contact the touch grid of the apparatus while the operator is at the normal impedance (i.e., not in direct contact with ground or other potentials) in order that the apparatus will operate. If the operator lets go of the touch grid or touches ground or a live potential the circuit turns the apparatus off.

SUMMARY OF THE INVENTION

Briefly stated and according to an aspect of this invention the problems associated with a differential current transformer to provide ground fault circuit protection only when an actual fault occurs in a portable appliance have been substantially overcome by providing the apparatus of this invention. This invention provides a safe, reliable, cost effective system for preventing the electrocution hazards to operators of electrical devices such as hand-held appliances and also teaches the operator not to use appliances or tools in an unsafe manner. The invention includes additional features such as the appliance operating only when an operator grasps the appliance in a predetermined manner. Whenever the operator releases his or her grip from the appliance the appliance automatically shuts off.

The invention also includes a conductive touch grid or plate which in combination with circuitry included in the hand-held appliance and/or plug assembly thereof is used to measure the operator's impedance to either side of the AC line. Whenever the impedance with respect to either side of the line is below a predetermined level, the supply current from the AC line is automatically interrupted by means of a switching element electrically connected in series with the line conductor thereby assuring that the operator is protected from using the appliance in an unsafe manner and from electrocution.

It is therefore an object of this invention to provide a sensitive electric shock prevention device which avoids the use of a differential transformer and its associated circuitry in a hand-held appliance.

It is a further object of this invention to provide an appliance having a protective circuit which will protect the operator from electrical shock hazards as well as allowing the appliance to be operable only when an included switching element is connected in series with the line conductor of an associated AC source.

It is still a further object of this invention to provide an appliance having a protective circuit which will only remain on when the operator makes contact with a touch grid or plate positioned in the gripping portion of the apparatus such as a hand-held dryer.

It is a further object of this invention to provide a hand-held appliance in which the appliance would turn off whenever the operator touches either side of the AC line or when any ground point was touched thereby teaching the operator to use the appliance in a safe manner while protecting the operator from electrocution.

It is still a further object of this invention to provide a cost effective appliance having ground fault circuit interrupter capabilities.

BRIEF DESCRIPTION OF THE DRAWINGS

The invention both as to its organization and principles of operation, together with further objects and advantages thereof may be better understood by referring to the following detailed description of an embodiment of the invention taken in conjunction with the accompanying drawings in which.

DESCRIPTION OF A PREFERRED EMBODIMENT

Figure 1:
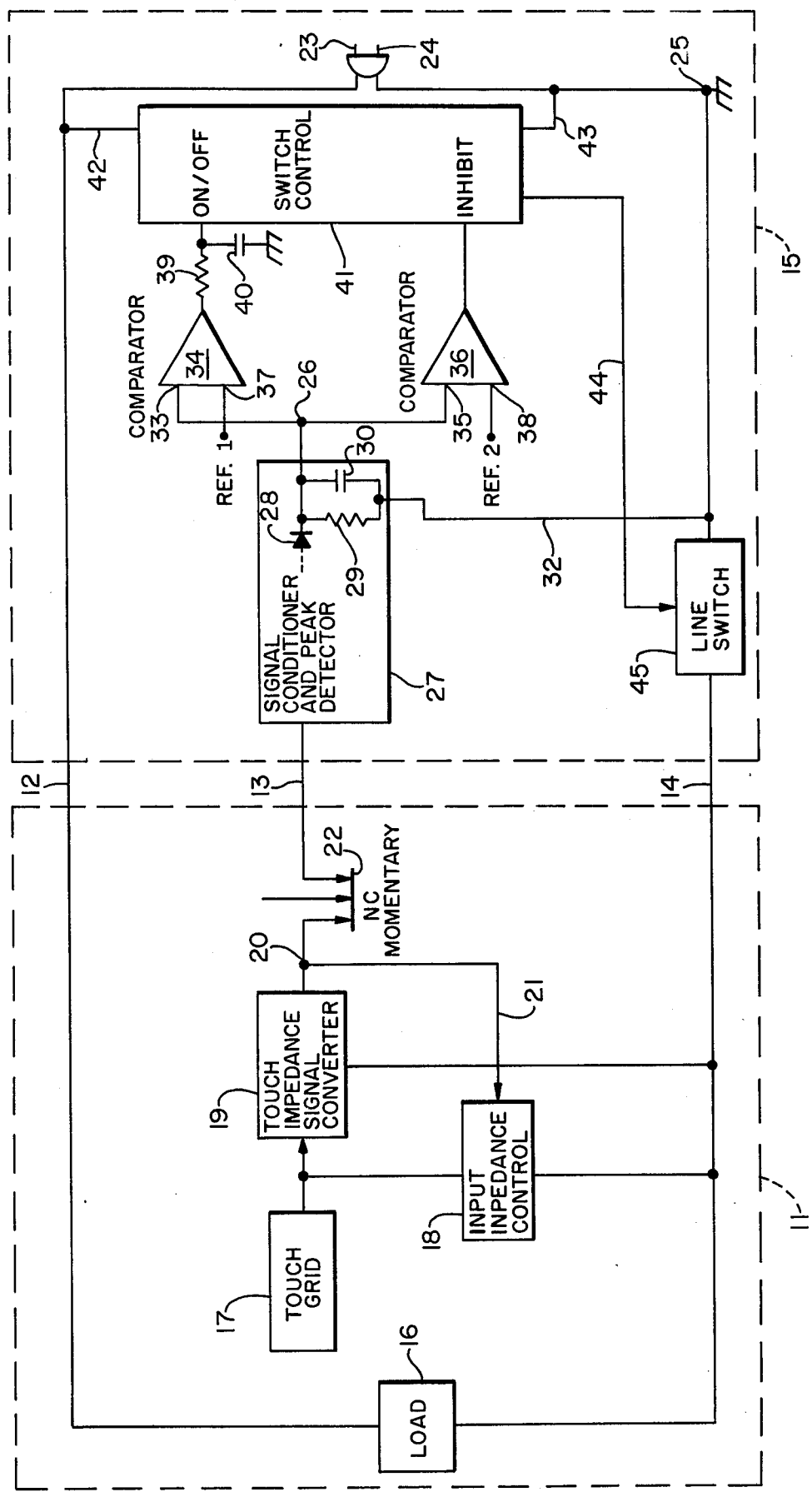
FIG. 1 is a block diagram illustrating an exemplary embodiment of means for providing ground fault circuit interrupter protection to the operator of an appliance, in accordance with this invention.

Referring now to FIG. 1, there is illustrated apparatus 11 electrically connected through conductors 12, 13, and 14 to a plug assembly 15. Apparatus 11 may take the form of an appliance, tool, or the like and preferably is of the hand-held variety such as a portable hair dryer or styling implement.

Apparatus 11 includes an electrical load designated by box 16 electrically connected through conductors 12 and 14 to the plug assembly 15. Included in apparatus 11 is a touch grid 17. This touch grid is preferably physically connected to the exterior of apparatus 11 such as at the gripping portion or handle of a hand-held appliance in order to insure that the operator of apparatus 11 will make physical contact with the touch grid, preferably when the operator naturally grips the apparatus 11 such as during the normal use of apparatus 11.

The touch grid 17 may be constructed in the plurality of well known configurations and methods of construction such as a grid pattern, solid conductive member, or the like with the main criteria being that the touch grid 17 include a conductive portion comprising an electrically conductive material such as a metal which will allow an electrical parameter of the operator, i.e., impedance, to be sensed with respect to the neutral and line conductor of an associated AC source such as that typically occurring at a wall outlet.

The output of the touch grid 17 is electrically connected to conductor 14 through an input impedance control 18 and to an input of a touch impedance signal converter 19. The touch impedance signal converter 19 is also electrically connected to conductor 14 and is further connected at an output to reference or signal point 20 which in turn is electrically connected in a feedback arrangement to an input of input impedance control 18 through feedback conductor 21. The signal point 20 is further connected to conductor 13 through a normally closed momentary switch 22.

The touch impedance signal converter 19 basically develops a proportional DC pulse stream, the level of which is determined by the impedance it receives at its input from the touch grid 17 and the input impedance control 18. The input impedance control 18 may comprise a single impedance such as a resistor without use of the feedback conductor 21. In a preferred embodiment, when increased sensitivity is desired, the feedback conductor 21, when used in combination with circuitry to be described later, is especially advantageous. When no feedback conductor such as feedback conductor 21 is utilized, a resistor in the range of 10 to 20 meg. ohms has been found satisfactory. In general, the input impedance control 18 is designed to compare impedance levels in a manner to be described subsequently.

The normally closed momentary switch 22 may be of variety of types well known in the art and will operate in the manner to be described subsequently.

Referring more particularly to the plug assembly 15, there is illustrated a first plug blade 23 and a second plug blade 24 electrically connected to conductors 12 and 14 respectively, and adapted to be electrically connected to (plugged into) in an associated AC source such as typically occurring in an AC outlet not shown. The ground indication at point 25 of plug assembly 15 is an internal reference and does not indicate that the plug blade 24 is necessarily electrically connected to either the neutral or line conductor of the associated AC outlet.

The components contained in the plug assembly 15 are positioned therein to correct for any potential electrical fault due to the electrical cord comprised of conductors 12, 13, and 14 between the apparatus 11 and the plug assembly 15. If such a hazard need not be considered, such as when the plug portion of apparatus is connected to the apparatus 11 without a line cord or for any other reason, the protective equipment contained in plug assembly 15 may be readily contained in apparatus 11.

Electrically connected between conductor 13 and a reference or signal point 26 is a signal conditioner and peak detector 27. The signal conditioner and peak detector 27 includes a diode 28 operating as part of the peak detector and the parallel combination of a resistor 29 and capacitor 30. The RC combination of resistor 29 and capacitor 30 make up the RC time constant which will be described in greater detail later. The signal conditioner and peak detector 27 receives the DC pulses from the output of the touch impedance signal converter 19 when the normally closed momentary switch 22 is closed thereby charging capacitor 30. The detector 27 receives no input through conductor 13 when normally closed momentary switch 22 is in its open state.

Signal point 26 is electrically connected to the first input terminal 33 of a comparator 34 and also to the first input terminal 35 of a comparator 36. The second input terminal 37 of comparator 34 is electrically connected to a voltage reference 1 and the second input terminal 38 of the comparator 36 is electrically connected to a voltage reference 2, all in a manner to be described subsequently. The output of comparator 34 is electrically connected through resistor 39 and a capacitor 40 electrically coupled to reference ground, to the on/off input of a switch control 41. The output of comparator 36 is electrically connected to an inhibit input of switch control 41. Comparator 34 and comparator 36 will produce an output signal when the voltage signal at their respective first input terminal is greater than the voltage signal applied to their respective second input terminal from voltage reference 1 and voltage reference 2 respectively.

The switch control 41 is further connected to plug blade 23 through conductor 42 and to plug blade 24 through conductor 43. Further, switch control 41 is electrically connected through control conductor 44 to a line switch 45. The line switch 45 which may take the form of any type of interruptable controllable switch such as a Triac, back to the back SCR, relays, etc. is electrically connected in series between plug blade 24 and conductor 14. If desired, an additional line switch (not shown) may be also placed in series between plug blade 23 and conductor 12. Such an additional line switch may readily be controlled by means of control conductor 44.

In operation, the operator will typically grasp the plug assembly 15 and position the plug blades 23 and 24 into an associated AC outlet. As is typically the case, the operator cannot be sure which of the plug blades will be electrically connected to the neutral conductor of the associated AC source or which of the blades will be electrically connected to the hot or line conductor of the AC source.

Assuming the plug assembly is positioned such that plug blade 23 is electrically connected to the hot or line conductor of the AC outlet (hereinafter called an incorrect connection or incorrectly plugged, with the references shown in FIG. 1) by the operator and the operator grips the housing of apparatus 11 thereby touching the touch grid 17 due to its chosen location typically associated with the gripping portion of the housing of apparatus 11, the following occurs. Since the unit is initially off, the switch 22 is normally closed and the line switch 45 is in its open or non-conducting state, thus the full line voltage occurring at plug blade 23 is applied through conductor 12 and load 16 through the input impedance control 18, the touch impedance signal converter 19 and switch 22 to the signal conditioner and peak detector 27. This typically large AC signal (120 volts AC) will result in the correspondingly typically high DC signal produced by the touch impedance signal converter 19 and through the signal conditioner and peak detector 27, a high DC signal greater than the chosen values of voltage reference 1 and voltage reference 2 exists at signal point 26. This signal is applied through respective first inputs 33 and 35 of comparators 34 and 36 respectively thereby resulting in a signal occurring at the inhibit terminal of the switch control 41. Correspondingly, no signal exists on control conductor 44 to activate line switch 45. That is, the signal at the inhibit terminal of switch control 41 is high, thereby keeping line switch 45 off. Although both outputs of comparators 34 and 36 are rendered high, the time constant produced by resistor 39 and capacitor 40 coupled to comparator 34 allow the high signal at the inhibit terminal of switch control 41 to inhibit the output prior to the time the on/off signal goes high.

Assuming that the plug assembly 15 is correctly electrically connected to the AC source, i.e., plug blade 23 is electrically connected to the neutral conductor of the AC source and plug blade 24 is electrically connected to the line or hot side of the AC source and the touch grid 17 is contacted by the operator in due course, the same method of operation results as described when the plug assembly was incorrectly plugged into the AC receptacle. More specifically, line switch 45 which is electrically connected in series with the hot conductor of the AC source through plug blade 24 is open. The voltage signals from plug blade 23 with respect to reference point 25 will ultimately be applied through conductor 12 and load 16 through input impedance control 18 to result in DC pulses applied through the signal conditioner and peak detector 27 to ultimately, in the manner previously described, render the outputs of comparators 34 and 36 high and thereby allow the high signal at the inhibit terminal of switch control 41 to keep the line switch 45 in its off or non-conducting state.

Whether or not the plug assembly 15 is correctly plugged into its associated AC receptacle, the operator would in due course urge the normally closed momentary switch 22 into its temporary open state and release the switch 22 which would then return to its normally closed position. If the operator does not let go of the switch 22 in order to allow it to return to its normally closed position prior to the voltage level at signal point 26 dropping below that of reference 1, a signal will exist at the on/off terminal of switch control 41 to render the line switch 45 off or non-conducting.

Assuming that the normally closed switch 22 is not held in its open position for a length of time to have the above occur, the interruption of the signal from conductor 13 to the input of the signal conditioner and peak detector 27, i.e., the apparatus 11 is disconnected from the plug assembly 15, the voltage signal stored on capacitor 30 discharges and drops the voltage at signal point 26 below the voltage level of reference 2. This automatically by design is above the voltage level of reference 1 for some period of time since the voltage assigned to reference 2 is greater than that assigned to reference 1. The amount of time that the voltage signal at signal point 26 is between voltage reference 2 and voltage reference 1 is determined by the RC time constant of resistor 29 and capacitor 30. Since the voltage signal applied to the first input terminal 35 of comparator 36 is less than the voltage applied to the second input terminal 38 of comparator 36 no output occurs from comparator 36. However, since a reference at first terminal 33 of comparator 34 is greater than the voltage reference from reference 1 applied to second terminal 37 of comparator 34 an output signal is realized from comparator 34 at the on/off terminal of switch control 41 thereby giving an "on" signal through control conductor 44 through the line switch 45 thereby rendering the line switch closed or conducting.

If the plug assembly 15 is not properly connected and the switch 22 has been released in time, the operator is closely coupled to ground and therefore the signal between the operator and neutral is relatively close and a low level signal appears at signal point 20. This signal at signal point 20 is peak detected by the signal conditioner and peak detector 27 and a very low DC signal appears at signal point 26. This voltage level at signal point 26 is lower than that of reference 1 and therefore no output appears from comparator 34 and from comparator 36 thereby removing the signal from the on/off terminal of switch control 41 and rendering the line switch 45 off or non-conductive.

More specifically, when improperly plugged in and switch 22 is released in time, the voltage of capacitor 30 decreases and drops below that of reference 2 (therefore no output from comparator 36), but an on signal is held at the on/off terminal of switch control 41 thereby keeping the line switch 45 conductive or on until the voltage signal at signal point 26 crosses below the voltage level of reference 1. Once this on signal applied at the on/off terminal of switch control 41 is removed, line switch 45 is rendered non-conductive.

Assuming switch 22 has been released in time and the plug assembly is correctly coupled to the AC source, i.e., line switch 45 is in series with the hot conductor of the AC source, the voltage between the operator and the hot side of the source is larger than before and results in a DC level at point 26 which is between the voltage levels of voltage reference 2 and reference 1. Therefore, an "on" indication is held at the on/off terminal of switch control 41 thereby keeping the line switch 45 in its on or conductive mode as long as the voltage signal at signal point 26 remains between voltage reference 2 and reference 1.

Assuming that the apparatus is operating as described above, all that is required to shut off the apparatus 11 is to have the operator release his or her grip from the touch grid 17. Electrically, the operator letting go of the touch grid 17 results in no signal difference at signal point 20 and therefore signal point 26 ultimately has a voltage level below that of voltage reference 1 resulting in no signal at the output of comparator 34 and correspondingly no signal at the on/off terminal of switch control 41 thereby rendering line switch 45 off or non-conducting.

If the operator or user desires to shut off the apparatus 11 without releasing his or her grip from the touch grid 17, the opening of the normally closed momentary switch 22 will likewise result in the voltage level at signal point 26 going below the voltage reference 1 thereby shutting off line switch 45.

Whether one shuts off apparatus 11 by letting go of the touch grid 17 or by opening the switch 22, the amount of time the operator must let go of the touch grid 17 and/or open switch 22 must be greater than the time determined by the RC time constant made up of resistor 29 and compacitor 30 in the signal conditioner and peak detector 27.

As long as the user of apparatus 11 is at a normal impedance (i.e., not in direct contact with ground or other potentials) the unit will continue to operate. When the user has a lower impedance to ground or to either side of the line, i.e., neutral or hot conductors, the potential for a dangerous condition occurs and the unit will automatically shut off.

For example, when the user touches either the neutral conductor directly (e.g. an uninsulated conductor) or any ground electrically coupled to the neutral, the user's impedance is brought toward the potential of the ground or neutral conductor resulting in an impedance which gets lower with respect to ground causing a higher voltage to appear at signal point 20. Resultingly, the voltage level at signal point 26 becomes greater than the voltage at reference 2 and the output of comparator 36 is applied to the inhibit terminal of the switch control 41 thereby rendering line switch 45 open or in its non-conducting state.

If the user of apparatus 11 is in a potentially dangerous position by touching the hot conductor (e.g. assuming the insulation is one away from the hot conductor) the resulting impedance with respect to the hot conductor decreases and therefore lowers the voltage level at signal point 20 and dropping the voltage level at signal point 26 below that of reference 1 thereby eliminating the output signal from comparator 34 to the on/off terminal of switch control 41 and rendering an "off" signal and shutting off line switch 45.

Figure 2:
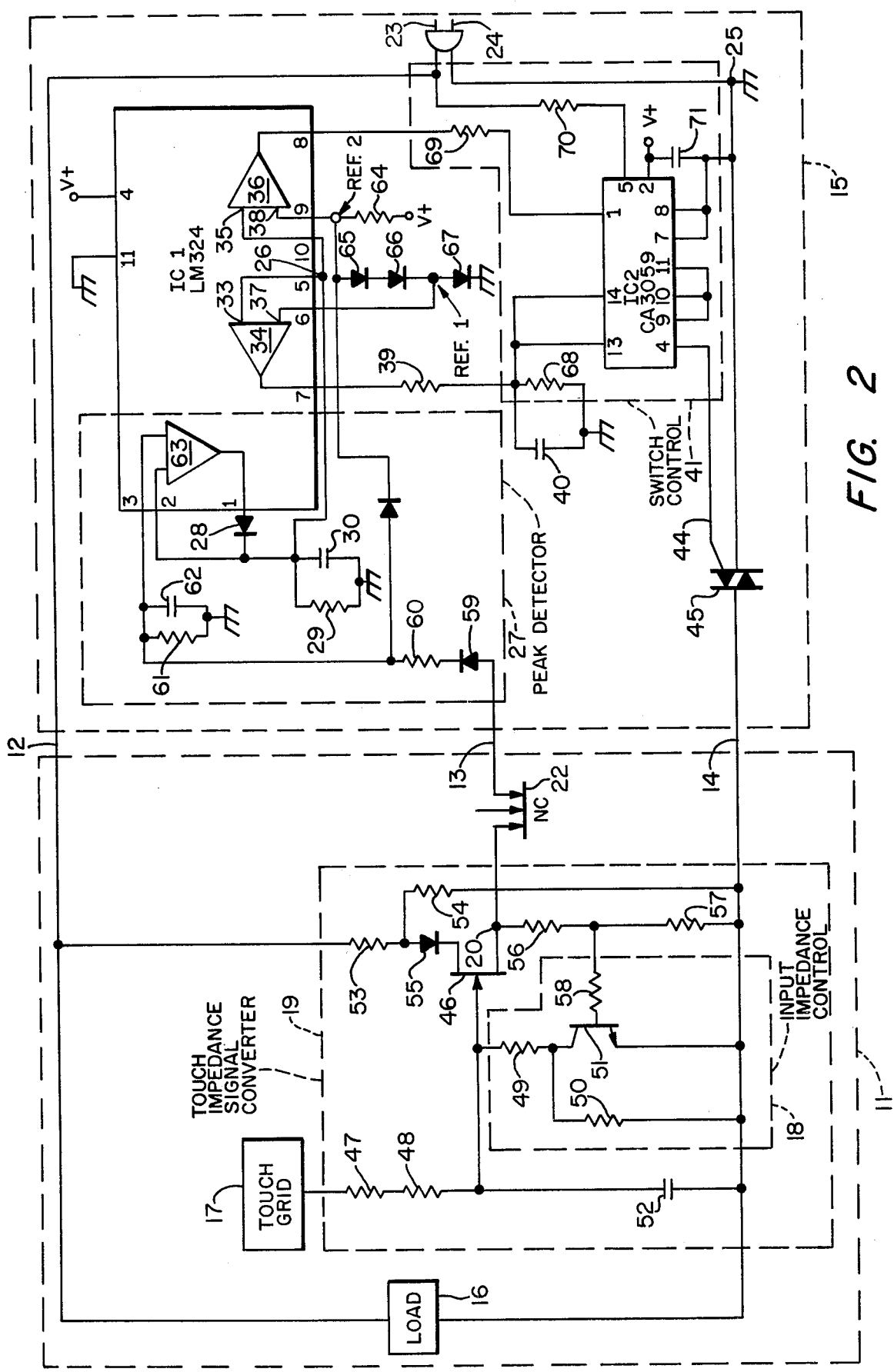
FIG. 2 is a schematic diagram illustrating an exemplary embodiment of circuitry for providing ground fault circuit interrupter capabilities in a hand-held appliance, in accordance with this invention.

Referring now to FIG. 2 there is illustrated apparatus 11 electrically connected through conductors 12, 13, and 14 to a plug assembly 15. A touch grid 17, which in an embodiment is a conductive pattern on the handle or gripping portion of apparatus such as a portable hair dryer, when contacted by the hand of the operator produces high impedance signals from the grid. These signals are buffered by way of field effect unijunction transistor 46. Resistors 47, 48, 49, and 50 (resistor 50 only when NPN transistor 51 is off or non-conducting) form a voltage divider from the touch grid 17 to the gate of transistor 46 and from there to the Triac 45 side of the load. The resistors 47 and 48 assure isolation to the user. Resistors 47 and 48 also form a high frequency noise filter with capacitor 52.

Resistors 53 and 54 and diode 55 provide a half wave recitified signal to the source of transistor 46. Transistor 46 in combination with resistors 56 and 57 form a source follower which provides a low impedance drive at the output of transistor 46. Resistors 56 and 57 also provide a portion of the output signal to transistor 51 and resistor 58. When the output of transistor 46 at signal point 20 is above approximately 14 volts, transistor 51 turns on and shorts out resistor 50, presenting a lower impedance (approximately 180,000 ohms) to the signal at signal point from the touch grid 17.

Switch 22 opens the output line to turn the unit on and off. Diode 59 provides only positive signals to the divider formed by resistors 60 and 61. Resistor 61 and capacitor 62 form a noise filter. The signal from the divider is fed into the ideal diode formed by diode 28 and operational amplifier 63. This signal is in turn fed to capacitor 30 in parallel with resistor 29. The peak detector formed in this way holds the peak signal for the time determined by resistor 29 and capacitor 30. The DC level from the peak detector is presented to comparators 34 and 36 included in integrated chip LM 324 manufactured by National Semiconductor. The reference voltages from the comparators 34 and 36 are established by resistor 64, diode 65, diode 66, and diode 67. The anode of diode 67 is one diode drop above ground (approximately 0.6 volts) and provides voltage reference 1 while the anode of diode 65 is approximately 1.8 volts above ground and provides voltage reference 2. Diode 28 clamps the input to amplifier 63 at approximately 2.4 volts above ground allowing the unit to be quickly turned on when switch 22 is depressed (i.e., the peak detector only has to drop from 2.4 volts).

When the input to comparator 34 is above reference 1, the output goes high. This signal is divided by resistor 39 and resistor 68 over to pins 13 and 14 of an integrated chip CA 3059 manufactured by RCA which in turn activates the Triac 45. Resistor 39 and capacitor 40 delay this signal when turning the unit off so that the inhibit signal can be present at pin 1 of integrated chip CA 3059 before this signal is presented to pins 13 and 14 of integrated chip CA 3059. When the input to comparator 36 is above reference 2 the output of comparator 36 goes high and drives current through resistor 69 to the inhibit terminal (pin 1 of integrated chip CA 3059) which in turn turns the Triac 45 off.

Resistor 70 and capacitor 71 are external components needed as part of the power supply circuit contained in integrated chip CA 3059.

Values of the components depicted in FIG. 2 are as follows:

Transistor 46—2N4339
Resistor 47—680K ohms
Resistor 48—680K ohms
Resistor 49—180K ohms
Resistor 50—11M ohms
Transistor 51—2N3904
Capacitor 52—100pf
Resistor 53—18K ohms
Resistor 54—6.2K ohms
Diode 55—1N4003
Resistor 56—130K ohms
Resistor 57—6.2K ohms
Resistor 58—100K ohms Diode 59—1N4003
Resistor 60—390K ohms
Resistor 61—39K ohms
Capacitor 62—.01uf
Diode 28—1N4148
Capacitor 30—1uf
Resistor 29—330K ohms
Resistor 64—10K ohms
Diode 65—1N4148
Diode 66—1N4148
Diode 67—1N4148
Resistor 39—2.7K ohms
Resistor 68—6.8K
Resistor 69—10K
Resistor 70—10K ohms (5 watts)
Capacitor 71—470uf.

In summary, the touch grid 17 is coupled to the switch side of the line through the input impedance control 18. Since one side of the AC line is tied to ground (i.e., the neutral side) and the other (the hot side) fluctuates with reference to it, the user's impedance to either side of the line is readily measured.

When the hot conductor is connected to the Triac side of the line, the user's normal impedance pulls the input of the signal converter 19 toward ground. If the line switch 45 is in the neutral side of the line the signal remains low. When properly connected, if the user touches something at ground potential, the signal is increased. If the user touches the hot side of the line the signal is attenuated. Letting go of the touch grid 17, the input impedance pulls the signal down toward the hot side (attenuating the signal).

In order to discriminate at high and at low impedance levels the input impedance is adjusted to given optimum performance (i.e., high impedance when sensing high impedance signals and low impedance for low impedance signals). The input impedance control 18 changes the input impedance in response to the output from the signal converter 19.

More specifically, since we are trying to detect two specific impedance levels out of a very wide range of impedances, input impedance control is most desirable. The touch grid 17 can "see" an impedance to ground of from approximately 1,000 ohms to 500 megohms, a range of almost a million to one. Through this range we would like to detect two critical impedance thresholds, one at about 100K ohms the other at about 200 megohms. Below 100K ohms the operator is approaching a point where he or she is in danger of electrocution if the operator were to come in contact with the hot side of the line. Between approximately 100K ohms and 200 megohms, the operator is safe and the unit should be on even if the operator approaches these extremes. Above 200 megohms is the impedance present when the operator is not touching the touch grid. One can see that it is much easier to distinguish say 100K ohms from 500K ohms with an input of about 180K ohms versus an input of 11 megohms (i.e., the voltage change resulting from a 100K ohm to 500K ohm impedance change with 180K ohms input impedance would be much larger than with 11 megohms input impedance).

The touch impedance signal converter 19 takes the high impedance AC signal from its input and converts it to a low source impedance half wave rectified signal which is proportional to the user's impedance to each side of the line.

This signal is then filtered, divided down, and a DC voltage proportional to the user's impedance is presented to the comparators. Reference 1 is adjusted between the level present when the user is not touching the grid and when he is touching it at normal impedance levels. When this reference level is exceeded, comparator 34 provides a signal to the switch control 41 which turns the switch "on" and powers the unit. Reference 2 is set to discriminate between the normal level and the level present when the user makes direct contact with ground. When this threshold is exceeded, comparator 36 provides an inhibit signal to the switch control 41 turning the unit off.

The momentary switch 22 and the two time constants (resistor 29, capacitor 30 and resistor 39, capacitor 40) gives the operator easy control of the unit by way of a single switch and allows the unit to be built with a three wire cord.

The unit is turned "on" and "off" in the following manner: Assuming the plug unit is properly connected, to turn the unit "on" the momentary switch is opened (depressed) for a short period of time (approximately 0.2 to 0.7 seconds, this range is determined by the time constant of capacitor 30 and resistor 29). Once "on", the unit may be turned "off" by opening (depressing the switch for a longer time period (greater than one second). This latching action is accomplished by the time constants of resistor 29/capacitor 30 and resistor 39/capacitor 40 and the action of Triac 45 as described below.

When the line switch 45 is off, the opposite conductor is still connected to the signal converter 19, this provides a very large signal to the comparators and hold the line switch 45 open. If the user depresses the momentary switch 22, this signal is disconnected and capacitor 30 discharges through resistor 29. The DC signal presented to the comparators then falls and remains between Reference 1 and Reference 2 for a time period controlled by resistor 29 and capacitor 30. The user must then release this switch which then connects the signal from the touch grid. If this level is proper, the unit then remains on.

If the user desires to turn the unit off, he also depresses the momentary switch only for a longer time period. During this time, capacitor 30 discharges below reference 1 turning the line switch 45 off. When the user releases the switch, the large signal from the opposite line conductor is present at the comparators. Time constant determined by resistor 39 and capacitor 40 delays the signal at comparator 34 until after comparator 36 signal inhibits the line switch holding the unit off.

While an embodiment and application of this invention has been shown and described, it will be apparent to those skilled in the art that many more modifications are possible without departing from the inventive concepts herein described. The invention, therefore, is not to be restricted except as is necessary by the prior art and by the spirit of the appended claims.

What is claimed as new and desired to be secured by Letters Patent of the United States is:

1. Apparatus electrically connectable to an AC source having a line conductor and a neutral conductor comprising:
    a housing including a contact portion capable of being touched by an operator of the apparatus;
    means for measuring an electrical parameter of the operator with respect to the line or neutral conductor of the AC source when the operator touches said contact portion; and switching means electrically connectable in series with the line conductor for electrically disconnecting the apparatus from the AC source when the measured electrical parameter of the operator indicates a predetermined electrically dangerous condition for the operator.

2. The apparatus as in claim 1 wherein said apparatus is a portable hand-held appliance.

3. The apparatus as in claim 2 wherein said appliance is a hair dryer.

4. The apparatus as in claim 1 wherein said contact portion includes an electrically conductive plate.

5. The apparatus as in claim 1 wherein said contact portion includes an electrically conductive grid.

6. The apparatus as in claim 1 wherein the electrical parameter is impedance and the electrically dangerous condition for the operator occurs when the impedance measured by said measuring means is below a predetermined level.

7. The apparatus as in claim 1 wherein the electrically dangerous condition for the operator occurs when the operator is closely electrically coupled to ground.

8. The apparatus as in claim 1 wherein the electrically dangerous condition for the operator occurs when the operator is closely electrically coupled to either the line or neutral conductor of the AC source.

9. The apparatus as in claim 1 wherein said apparatus includes a plug assembly means having a first and second blade portion adapted to be releasably electrically connected to the AC source, said switching means being positioned in said plug assembly means.

10. The apparatus as in claim 1 further including an electrically responsive working portion disposed in said housing, and also including automatic shut off means electrically connected to said working means for turning said working means off when the operator of said apparatus releases touch from said contact portion of said housing.

11. The apparatus as in claim 1 wherein said switching means is a Triac.

12. A portable electrical hand-held appliance electrically connectable to an AC source having a line conductor and a neutral control comprising:
a housing including a conductive contact portion capable of being touched by an operator of the appliance;
means for measuring the impedance of the operator with respect to the line or neutral conductor of the AC source when the operator touches said contact portion; and
switching means electrically connectable in series with the line conductor for electrically disconnecting the appliance from the AC source when the impedance is below a predetermined level thereby indicating that the operator is in a predetermined electrically dangerous posture.

13. The appliance as in claim 12 further including an electrically responsive working portion disposed in said housing, and also including automatic shut off means electrically connected to said working means for turning said working means off when the operator of said appliance releases touch from said contact portion of said housing.

14. A portable electrical hand-held appliance electrically connectable to an AC source having a line conductor and a neutral control comprising:
a housing including a conductive contact portion capable of being touched by an operator of the appliance;
circuit means for measuring the impedance of the operator with respect to the line or neutral conductor of the AC source when the operator touches said contact portion, said circuit means including a touch impedance signal converter having an input terminal and an output terminal electrically connected to said contact portion for developing at said output terminal a proportional DC pulse stream at a level determined by the impedance received at said input terminal and an input impedance control also electrically connected to said input terminal; and
switching means electrically connectable in series with the line conductor for electrically disconnecting the appliance from the AC source when the impedance of the operator is below a predetermined level thereby indicating that the operator is in a predetermined electrically dangerous posture.

15. The appliance as in claim 14 wherein said input impedance control includes a resistor.

16. The appliance as in claim 14 further including a feedback connection means electrically connecting the output terminal of said touch impedance signal converter to an input of said input impedance control so that the impedance at said input terminal of said touch impedance signal converter is changed in response to the pulse stream at said output terminal of said converter.

17. The appliance as in claim 16 wherein said input impedance control includes a voltage divider.

* * * * *